United States Patent
Negoro et al.

(10) Patent No.: US 9,923,019 B2
(45) Date of Patent: Mar. 20, 2018

(54) SEMICONDUCTOR DEVICE, MANUFACTURING METHOD THEREOF AND IMAGING APPARATUS

(71) Applicants: Takaaki Negoro, Osaka (JP); Yoshinori Ueda, Hyogo (JP); Katsuyuki Sakurano, Hyogo (JP); Yasukazu Nakatani, Hyogo (JP); Kazuhiro Yoneda, Osaka (JP); Katsuhiko Aisu, Hyogo (JP)

(72) Inventors: Takaaki Negoro, Osaka (JP); Yoshinori Ueda, Hyogo (JP); Katsuyuki Sakurano, Hyogo (JP); Yasukazu Nakatani, Hyogo (JP); Kazuhiro Yoneda, Osaka (JP); Katsuhiko Aisu, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/935,973

(22) Filed: Nov. 9, 2015

(65) Prior Publication Data
US 2016/0133763 A1    May 12, 2016

(30) Foreign Application Priority Data
Nov. 11, 2014  (JP) .................. 2014-228766

(51) Int. Cl.
*H01L 31/0224* (2006.01)
*H04N 5/378* (2011.01)
(Continued)

(52) U.S. Cl.
CPC .. *H01L 27/14681* (2013.01); *H01L 27/14612* (2013.01)

(58) Field of Classification Search
None
See application file for complete search history.

(56) References Cited

U.S. PATENT DOCUMENTS

| 5,031,019 A | 7/1991 | Kosaka et al. |
| 5,227,793 A | 7/1993 | Aisu |

(Continued)

FOREIGN PATENT DOCUMENTS

| JP | 2013-69801 | 4/2013 |
| JP | 2013-187527 | 9/2013 |

OTHER PUBLICATIONS

U.S. Appl. No. 07/289,909, filed Dec. 27, 1988.
(Continued)

*Primary Examiner* — Fernando L Toledo
*Assistant Examiner* — Lawrence-Linh T Nguyen
(74) *Attorney, Agent, or Firm* — Cooper & Dunham LLP

(57) ABSTRACT

A semiconductor device for converting incident light into an electric current includes a semiconductor substrate; an electrode embedded in the semiconductor substrate; an insulation film contacting the electrode in the semiconductor substrate; a first semiconductor region of a first conductivity type, a second semiconductor region of a second conductivity type and a third semiconductor region of the first conductivity type, formed sequentially in a depth direction from a side of a front face of the semiconductor substrate; and a fourth semiconductor region of the second conductivity type contacting the insulation film and the second semiconductor region. An impurity concentration of the fourth semiconductor region is greater than an impurity concentration of the second semiconductor region.

18 Claims, 15 Drawing Sheets

(51) Int. Cl.
  *H04N 5/361* (2011.01)
  *H01L 31/0352* (2006.01)
  *H01L 31/18* (2006.01)
  *H01L 27/146* (2006.01)

(56) References Cited

U.S. PATENT DOCUMENTS

| | | | |
|---|---|---|---|
| 5,911,694 | A  | 6/1999  | Ikeda et al. |
| 6,278,322 | B1 | 8/2001  | Aisu et al. |
| 6,552,603 | B2 | 4/2003  | Ueda |
| 6,894,350 | B2 | 5/2005  | Shimizu et al. |
| 6,894,365 | B2 | 5/2005  | Ueda |
| 6,917,081 | B2 | 7/2005  | Ueda et al. |
| 6,937,001 | B2 | 8/2005  | Ueda |
| 7,242,059 | B2 | 7/2007  | Negoro et al. |
| 7,262,447 | B2 | 8/2007  | Negaro et al. |
| 7,381,066 | B2 | 6/2008  | Higashiguchi et al. |
| 7,382,187 | B2 | 6/2008  | Aisu |
| 7,394,307 | B2 | 7/2008  | Negoro et al. |
| 7,474,145 | B2 | 1/2009  | Negoro |
| 7,646,242 | B2 | 1/2010  | Negoro |
| 7,675,951 | B2 | 3/2010  | Nakatani |
| 7,694,886 | B2 | 4/2010  | Tan et al. |
| 7,719,242 | B2 | 5/2010  | Negoro |
| 7,755,337 | B2 | 7/2010  | Negoro |
| 7,773,491 | B2 | 8/2010  | Nakatani |
| 7,842,967 | B2 | 11/2010 | Ohtsuka et al. |
| 8,169,039 | B2 | 5/2012  | Negaro |
| 8,378,747 | B2 | 2/2013  | Aisu |
| 8,531,237 | B2 | 9/2013  | Aisu |
| 8,878,599 | B2 | 11/2014 | Negoro |
| 8,969,810 | B2 | 3/2015  | Nagahisa et al. |
| 8,975,939 | B2 | 3/2015  | Negoro et al. |
| 9,059,065 | B2 | 6/2015  | Hayashi et al. |
| 2004/0145016 | A1  | 7/2004  | Ueda |
| 2006/0152284 | A1  | 7/2006  | Morino |
| 2013/0127504 | A1  | 5/2013  | Hayashi et al. |
| 2013/0187030 | A1  | 7/2013  | Hayashi et al. |
| 2013/0234277 | A1* | 9/2013  | Negoro ............ H01L 27/14681 257/443 |
| 2014/0239158 | A1  | 8/2014  | Hayashi et al. |
| 2014/0367550 | A1  | 12/2014 | Aisu et al. |
| 2015/0070546 | A1  | 3/2015  | Negoro et al. |
| 2015/0076572 | A1  | 3/2015  | Sakurano et al. |
| 2015/0171129 | A1  | 6/2015  | Sakurano et al. |
| 2015/0214413 | A1  | 7/2015  | Negoro et al. |
| 2015/0229293 | A1  | 8/2015  | Nagahisa et al. |
| 2015/0264280 | A1  | 9/2015  | Yoneda et al. |

OTHER PUBLICATIONS

U.S. Appl. No. 14/788,991, filed Jul. 1, 2015.
Chinese official action dated Jan. 3, 2017 (and English translation thereof) in corresponding Chinese Patent Application No. 201510765679.8.

* cited by examiner

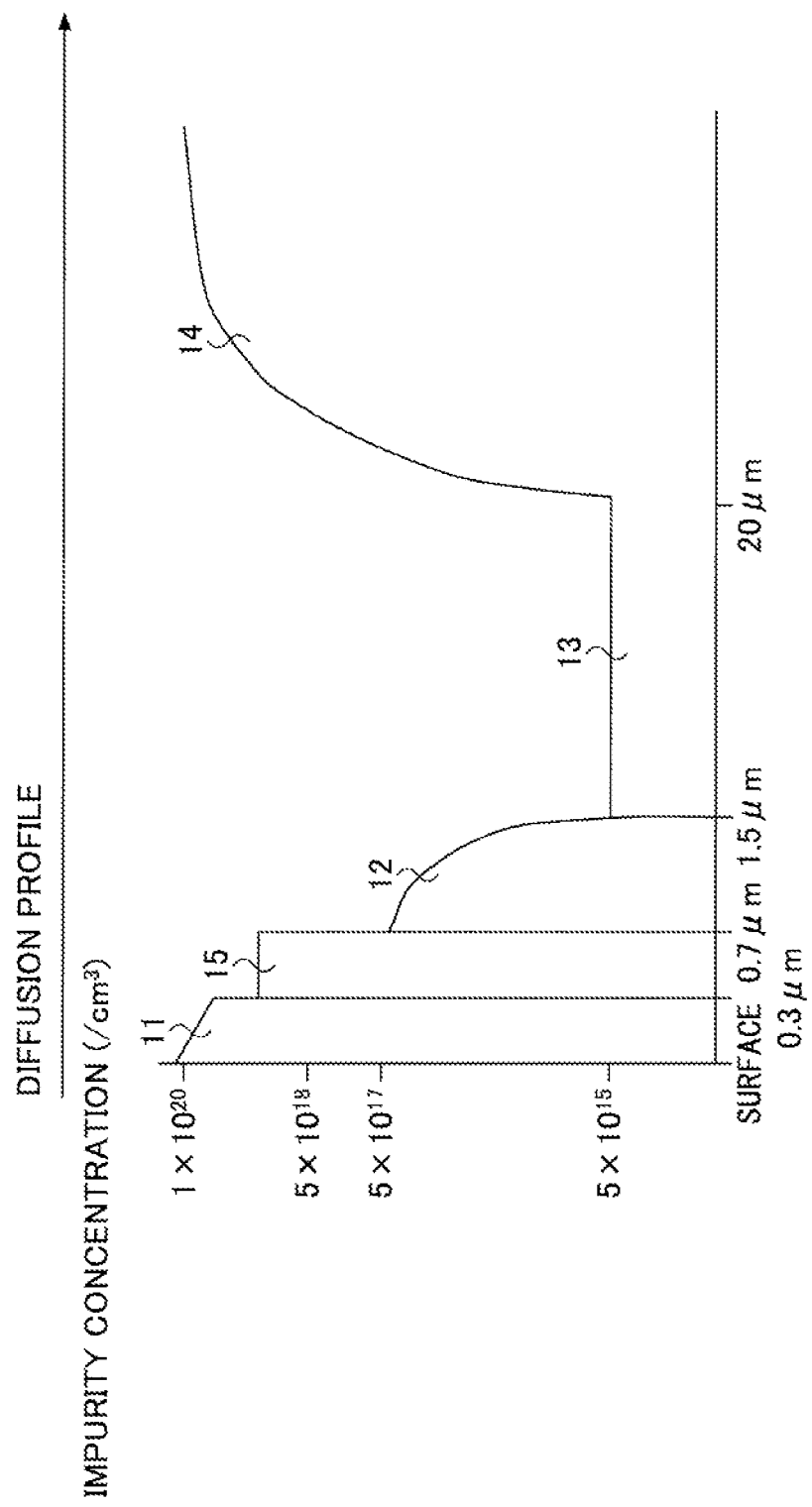

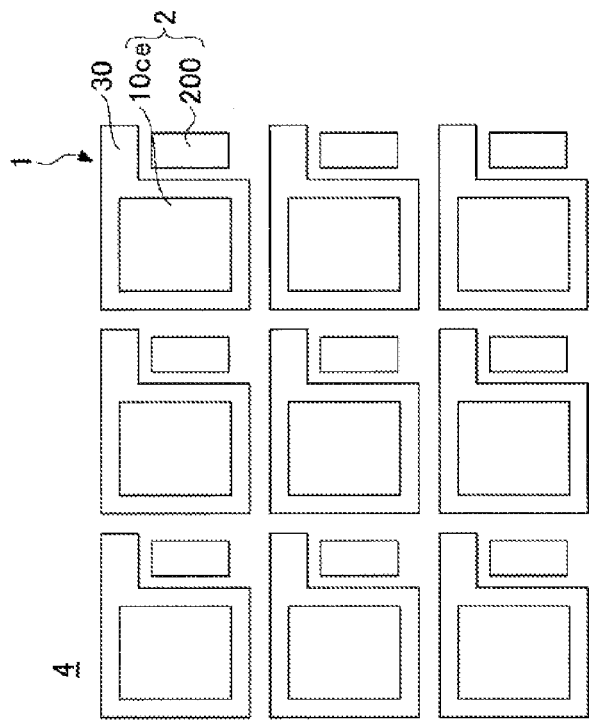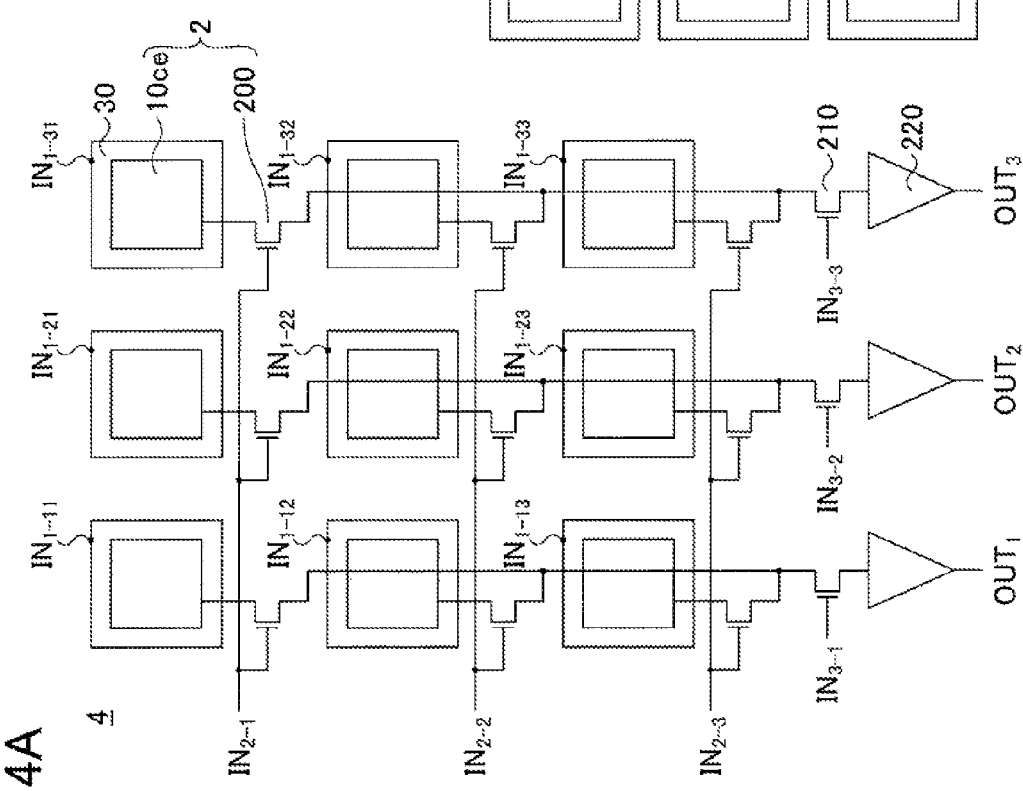

SEMICONDUCTOR DEVICE, MANUFACTURING METHOD THEREOF AND IMAGING APPARATUS

BACKGROUND OF THE INVENTION

1. Field of the Invention

The disclosures herein generally relate to a semiconductor device, a manufacturing method thereof and an imaging apparatus.

2. Description of the Related Art

A phototransistor having a bipolar structure has a feature of amplifying an electric current according to a physical property, which the bipolar structure has, on outputting a photo-electric current obtained at a photo diode located between a collector and a base from an emitter. Therefore, sensitivity is enhanced with a smaller light-receiving area in a case where light intensity is low.

However, although the sensitivity in the case where light intensity is low is enhanced, the photo transistor has a difficult aspect in a treatment, such that careful handling is required for saturation of an output signal, since the photo-electric current increases, as the light intensity becomes greater. Then, for example, Japanese Published Patent Application No. 2013-187527 discloses a technique of varying sensitivity for light intensity by varying a current amplification factor of a photo transistor, and thereby obtaining a proper sensitivity for each of the light intensities.

SUMMARY OF THE INVENTION

It is a general object of at least one embodiment of the present invention to provide a semiconductor device, a manufacturing method thereof and an imaging apparatus that substantially obviate one or more problems caused by the limitations and disadvantages of the related art.

In one embodiment, a semiconductor device for converting incident light into an electric current, includes a semiconductor substrate; an electrode embedded in the semiconductor substrate; an insulation film contacting the electrode in the semiconductor substrate; a first semiconductor region of a first conductivity type, a second semiconductor region of a second conductivity type and a third semiconductor region of the first conductivity type, formed sequentially in a depth direction from a side of a front face of the semiconductor substrate; and a fourth semiconductor region of the second conductivity type contacting the insulation film and the second semiconductor region. An impurity concentration of the fourth semiconductor region is greater than an impurity concentration of the second semiconductor region.

In another embodiment, an imaging apparatus includes semiconductor device for converting incident light into an electric current arranged two-dimensionally. The semiconductor device includes a semiconductor substrate; an electrode embedded in the semiconductor substrate; an insulation film contacting the electrode in the semiconductor substrate; a first semiconductor region of a first conductivity type, a second semiconductor region of a second conductivity type and a third semiconductor region of the first conductivity type, formed sequentially in a depth direction from a side of a front face of the semiconductor substrate; and a fourth semiconductor region of the second conductivity type contacting the insulation film and the second semiconductor region. An impurity concentration of the fourth semiconductor region is greater than an impurity concentration of the second semiconductor region.

In yet another embodiment, a manufacturing method of a semiconductor device for converting incident light into an electric current includes forming an insulation film in a semiconductor substrate; embedding an electrode so as to contact the insulation film in the semiconductor substrate; forming sequentially a first semiconductor region of a first conductivity type, a second semiconductor region of a second conductivity type and a third semiconductor region of the first conductivity type in a depth direction from a side of a front face of the semiconductor substrate; and forming a fourth semiconductor region of the second conductivity type so as to contact the insulation film and the second semiconductor region. An impurity concentration of the fourth semiconductor region is greater than an impurity concentration of the second semiconductor region.

According to the embodiment of the present invention, a semiconductor device in which sensitivity for light intensity can be enhanced while suppressing an increase of dark current is provided.

BRIEF DESCRIPTION OF THE DRAWINGS

Other objects and further features of embodiments will become apparent from the following detailed description when read in conjunction with the accompanying drawings, in which:

FIG. 2 is a diagram illustrating an example of a diffusion profile of the semiconductor device according to the first embodiment;

FIGS. 14A and 14B are diagrams illustrating another example of the imaging apparatus in which the single imaging cells are arranged two-dimensionally according to the second embodiment.

DESCRIPTION OF THE PREFERRED EMBODIMENTS

Figure 1A:
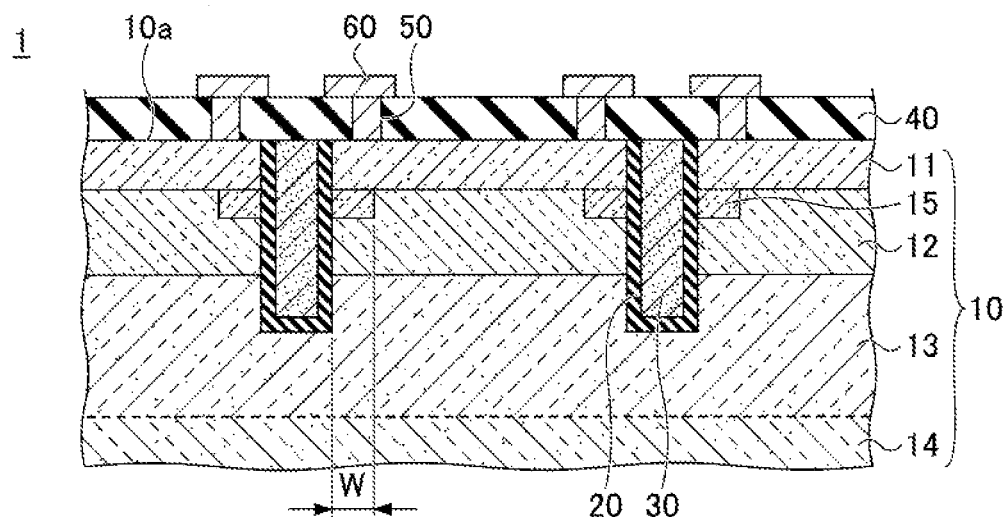
FIGS. 1A and 1B are diagrams illustrating an example of a main part of a semiconductor device according to a first embodiment.

In the following, embodiments of the present invention will be described with reference to the accompanying drawings. In the respective drawings, the same reference numeral is assigned to the same component and duplicate explanation may be omitted.

First Embodiment

[Structure of Semiconductor Device]

Figure 1B:
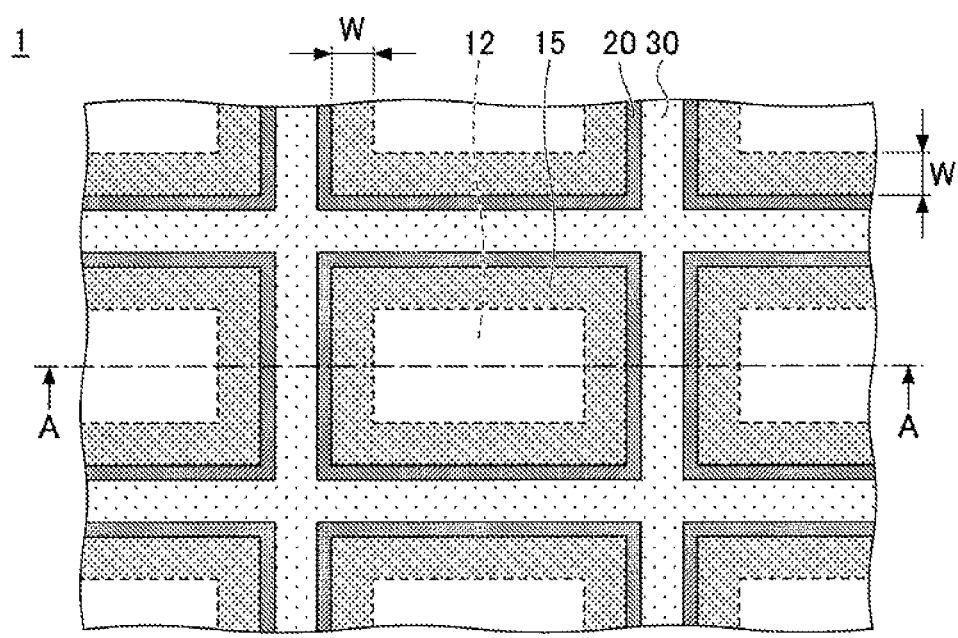

FIGS. 1A and 1B are diagrams illustrating an example of a main part of a semiconductor device according to a first embodiment. FIG. 1B is a plan view, and FIG. 1A is a cross-sectional diagram cut along a line "A-A" in FIG. 1B. Meanwhile, in FIG. 1B, only a base region 12, a high impurity concentration region 15, an insulation film 20 and an electrode 30 are illustrated, and a satin pattern is appropriately used as a matter of convenience.

A semiconductor device 1, as shown in FIGS. 1A and 1B, is, for example, a photo transistor including plural light receiving cells which perform photo-electric conversion for incident light. The semiconductor device 1 includes a semiconductor substrate 10, the insulation film 20 and the electrode 30. On a front face 10a of the semiconductor substrate 10, an interlayer insulation film 40 is formed. On the interlayer insulation film 40, a metal electrode 60 is formed. Since in the semiconductor device 1 the respective light receiving cells function as photo transistors, the semiconductor device 1 may be referred to as a photo transistor array. However, although the present embodiment exemplifies the semiconductor device 1 including plural light receiving cells, the semiconductor device 1 may be provided with a single light receiving cell.

Meanwhile, in the present embodiment, as a matter of convenience, a side of the metal electrode 60 will be referred to as a front side or an upper side, and a side of a low resistance region 14, which will be described later, will be referred to as a back side or a lower side. Moreover, a surface on a side of the metal electrode 60 of each part will be referred to as a front face or an upper face, and a surface on a side of the low resistance region 14 will be referred to as a back face or a lower face. However, the semiconductor device 1 can be used in a state of upside down, or may be arranged with an arbitrary angle. Moreover, a plan view indicates viewing an object in a normal direction to the front face 10a of the semiconductor substrate 10, and a planar shape indicates a shape of an object viewed in the normal direction to the front face 10a of the semiconductor substrate 10.

The semiconductor substrate 10 is, for example, a silicone substrate. On the semiconductor substrate 10, an emitter region 11, a base region 12, and a collector region 13 are sequentially formed in a depth direction from a side of the front face 10a of the semiconductor substrate 10. A lower side of the collector region 13 is, for example, referred to as an N$^+$-type low resistance region 14. The emitter region 11 is electrically connected to the metal electrode 60 (emitter electrode) via a contact 50. Meanwhile, a collector electrode may be provided on a back face of the low resistance region 14, The emitter region 11 is, for example, N$^+$-type. A thickness of the emitter region 11 may be set to about 0.2 to 0.4 μm, for example. The base region 12 is, for example, P-type. A thickness of the base region 12 may be set to about 0.5 to 1.4 μm, for example. The collector region 13 is, for example, N-type. A thickness of the collector region 13 may be set to about 5 to 30 μm, for example.

Meanwhile, the emitter region 11 is a representative example of a first semiconductor region of a first conductivity type according to the present invention. Moreover, the base region 12 is a representative example of a second semiconductor region of a second conductivity type according to the present invention. Moreover, the collector region 13 is a representative example of a third semiconductor region of the first conductivity type according to the present invention. Here, the first conductivity type means any one of the P-type or the N-type. The second conductivity type means the P-type or the N-type, which is an opposite conductivity type to the first conductivity type.

As shown in FIG. 2, an impurity concentration of the emitter region 11 can be set to, for example, about $1 \times 10^{20}$ cm$^{-3}$. An impurity concentration of the base region 12 is inclined, i.e. a high impurity concentration on a side of the emitter region 11 and a low impurity concentration on a side of the collector region 13. The impurity concentration of the base region 12 may be, for example, about $5 \times 10^{17}$ cm$^{-3}$ just below the emitter region 11, and about $5 \times 10^{15}$ cm$^{-3}$ on the side of the collector region 13.

Returning to FIG. 1, the electrode 30 is embedded in the semiconductor substrate 10 from a side of the front face 10a. Moreover, the insulation film 20 insulating the electrode 30 from the semiconductor substrate 10 is provided in contact with the electrode 30 in the semiconductor substrate 10. The insulation film 20 may include, for example, a silicon dioxide film or a silicon nitride film. A thickness of the insulation film 20 may be set to, for example, about 10 to 40 nm. The electrode 30 may be made of, for example, resistance-reduced N-type polysilicon having an impurity concentration of greater than or equal to $1 \times 10^{20}$ cm$^{-3}$. A width of the electrode 30 may be set to, for example, about 0.3 to 0.8 μm. A depth of the electrode 30 may be set to, for example, about 4 to 20 μm.

In the present embodiment, the electrode 30 passes through the emitter region 11 and the base region 12, and an apical part of the electrode 30 reaches the collector region 13. Each of the regions partitioned by the electrode 30 functions as a light receiving cell. That is, the semiconductor device 1 is a photo transistor having a common collector potential, in which plural light receiving cells each having configurations of extracting photo-electric current from an emitter side are arranged. A width of the light receiving cell (interval between adjacent electrodes 30) may be set to, for example, about 3 to 20 μm.

In this way, the semiconductor device 1 has a vertical bipolar structure, in which the emitter region 11 contacting the electrode 30 via the insulation film 20, the base region 12 and the collector region 13 are sequentially formed in the depth direction from the side of the front face 10a of the semiconductor substrate 10. According to the above-described configuration, by applying a voltage to the electrode 30, a region around the electrode 30 is influenced by an electric field, and especially a width of the base region 12 which is a quasi-neutral region varies, and as a result a current amplification factor of the semiconductor device 1 can be changed.

Moreover, the impurity concentration of the base region 12 is inclined, with a high impurity concentration on the side of the emitter region 11 and a low impurity concentration on the side of the collector region 13. According to the above-described configuration, upon applying an electric voltage to the electrode 30, a depletion layer occurring in the base region 12 on the side of the collector region 13 becomes easy to spread from around the electrode 30 into the inside. Then, compared with the case where the impurity concentration in the base region 12 is uniform, the change in the current amplification factor can be made greater.

In the semiconductor device 1, in a region which is deeper than the emitter region 11 and shallower than the collector region 13, a high impurity concentration region 15, which contacts the insulation layer 20 and the base region 12, is arranged. The high impurity concentration region 15 has the same conductivity type as the base region 12 ($P^+$-type in the present embodiment), and has greater impurity concentration than the greatest impurity concentration in the base region 12. The high impurity concentration region 15 is a representative example of a fourth semiconductor region of the second conductivity type according to the present invention.

The high impurity concentration region 15 may be arranged anywhere as long as it contacts the insulation film 20 and the base region 12. In the present embodiment, a high impurity concentration region 15 having a planar shape of a picture frame shape is arranged just below the emitter region 11. In a plan view, inside the high impurity concentration region 15 (central part of the light receiving cell), the base region 12 is arranged. In other words, in a plan view, the high impurity concentration region 15 lies adjacent to the base region 12.

As shown in FIG. 2, the impurity concentration of the high impurity concentration region 15 is preferably greater than or equal to ten times the greatest impurity concentration in the base region 12. For example, in a case where the impurity concentration in the base region 12 is greater than or equal to $5 \times 10^{16}$ cm$^{-3}$ but less than or equal to $5 \times 10^{17}$ cm$^{-3}$, the impurity concentration of the high impurity concentration region 15 is preferably greater than or equal to $5 \times 10^{18}$ cm$^{-3}$. This is because it becomes possible to make a threshold value of a parasitic MOS (Metal Oxide Semiconductor) transistor 90, which will be described later, greater.

Meanwhile, the threshold value of the parasitic MOS transistor 90 is determined based on the film thickness of the insulation film 20 between the electrode 30 and the base region 12 and a base diffusive concentration of the base region 12 adjacent to the insulation film 20. Therefore, by arranging the high impurity concentration region 15 to make the concentration in the base region 12 greater, a desired threshold value can be obtained. Moreover, also by changing the film thickness of the insulation film 20, the threshold value can be changed.

However, since the high impurity concentration region 15 lowers the current amplification factor upon photo-electric conversion, a width thereof is preferably smaller. Therefore, it is preferable to set a borderline width that can change the threshold value of the parasitic MOS transistor 90, i.e. a borderline distance that the electric field reaches upon applying the electric voltage to the electrode 30.

To give a specific example, in a case where the electric voltage applied to the electrode 30 is about 5 V, taking account of a width of the depletion layer which increases according to the application of the electric voltage, the width W of the high impurity concentration region 15 is preferably about 0.2 to 1.0 μm. In this case, since if the width of the light receiving cell is about 3 to 20 μm, the base region 12 resides just below the emitter region 11 in the central part of the light receiving cell, decreasing of the current amplification factor can be prevented.

Figure 3A:
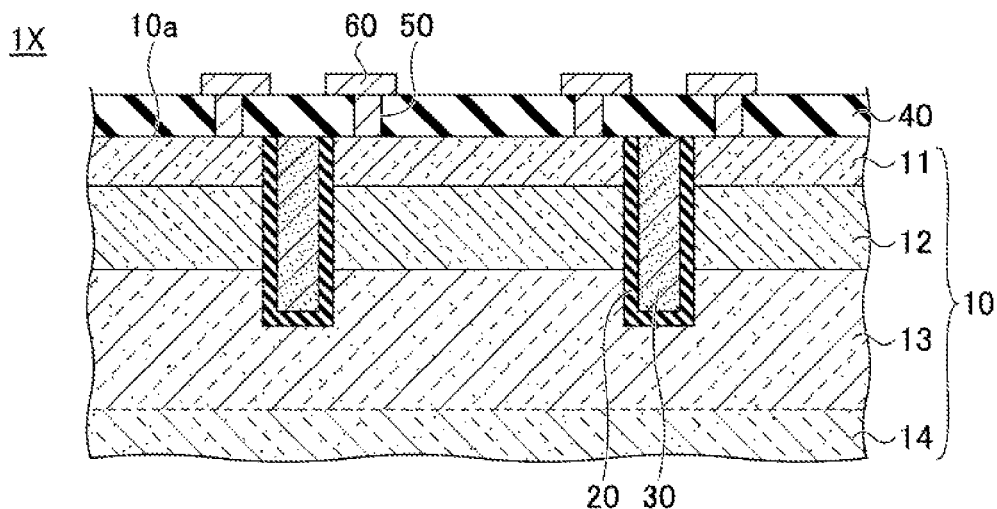
FIGS. 3A and 3B are diagrams illustrating an example of a semiconductor device according to a comparative example.
Figure 3B:
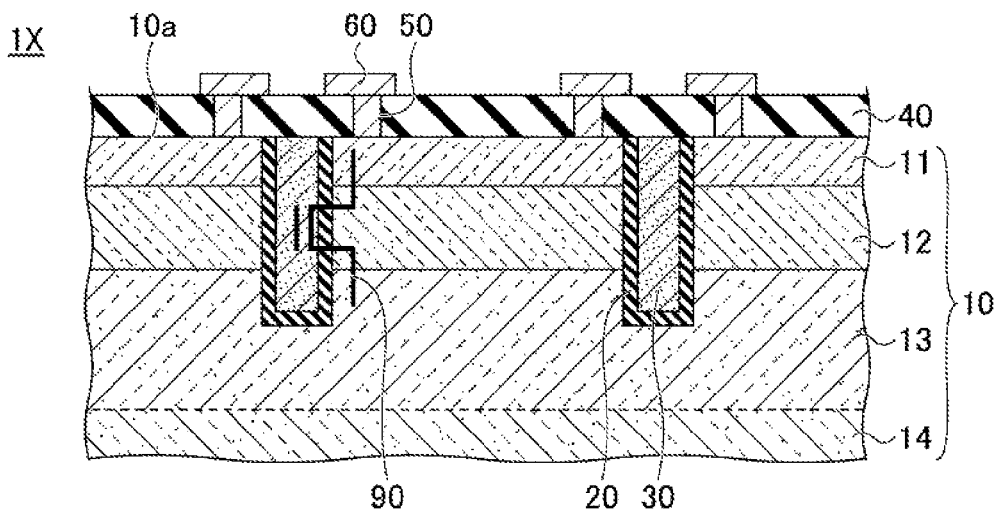

Here, technical meaning of providing the high impurity concentration region 15 in the semiconductor device 1 will be explained with reference to a comparative example. FIGS. 3A and 3B are diagrams illustrating an example of a semiconductor device according to the comparative example. The semiconductor device 1X according to the comparative example is different from the semiconductor device 1 according to the present invention (see FIGS. 1A and 1B) in that the high impurity concentration region 15 is not provided.

In a case of treating the semiconductor device 1X shown in FIG. 3A as a photo transistor, a presence of a parasitic MOS transistor 90 show in FIG. 3B causes a problem. The parasitic MOS transistor is formed in an emitter region 11 contacting an electrode 30 via an insulation film 20, a base region 12 and a collector region 13. The emitter region 11 becomes a source of the parasitic MOS transistor 90, and the collector region 13 becomes a drain of the parasitic MOS transistor 90. Moreover, the base region 12 becomes a channel of the parasitic MOS transistor 90.

In a case of applying an electric voltage to the electrode 30 in the semiconductor device 1X in order to increase a current amplification factor, the parasitic MOS transistor 90 turns ON and an electric current irrespective of a photo-electric current is added. There is a problem that due to the electric current added by the parasitic MOS transistor 90 turning ON, a dark current increases, and sensitivity under a low intensity of illumination is reduced.

Especially, in a case of reducing the impurity concentration of the base region 12 in order to increase the current amplification factor, a threshold value of the parasitic MOS transistor 90 turning ON decreases and the dark current increases. Moreover, in a case of reducing the size of the light receiving cell, since a ratio of the parasitic MOS transistor 90 occupying in the light receiving cell increases, due to an influence of an electric field occurring by applying the electric voltage to the electrode 30, the threshold value of the parasitic MOS transistor 90 turning ON decreases and the dark current increases.

In this way, in the conventional semiconductor device 1X, although it is possible to vary the current amplification factor by applying an electric voltage to the electrode 30, it is not possible to control the threshold value of the parasitic MOS transistor 90, and an increase of dark current cannot be suppressed.

Then, in the semiconductor device 1 according to the first embodiment, by providing the high impurity concentration region 15, a channel concentration of the parasitic MOS transistor 90 is made greater, and the threshold value of the parasitic MOS transistor 90 is shifted to higher. In this way, by making the threshold value of the parasitic MOS transistor 90 greater than the conventional one, the increase of dark current can be suppressed.

Figure 4:
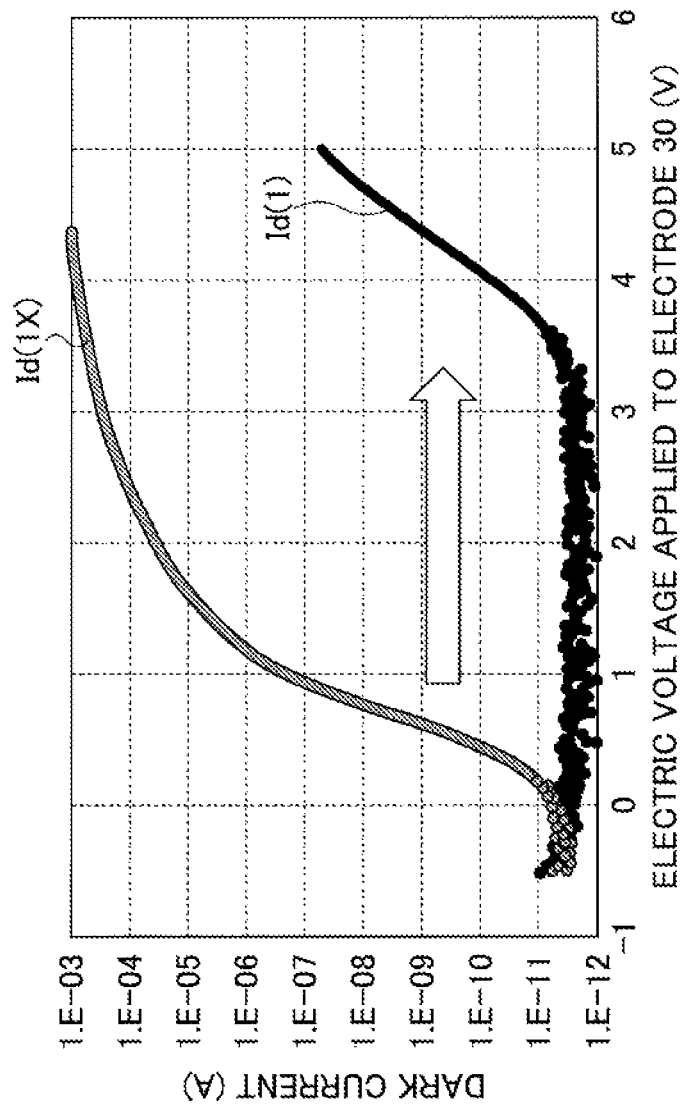
FIG. 4 is a diagram illustrating a threshold value shifting by providing a high impurity concentration region.

FIG. 4 is a diagram illustrating the threshold value shifting by providing the high impurity concentration region. FIG. 4 shows a relation between the electric voltage (abscissa) to be applied to the electrode 30 and the dark current (ordinate) in the semiconductor devices 1 and 1X. Meanwhile, the axis of ordinate is a logarithmic axis.

Specifically, data in FIG. 4 are obtained by measuring the emitter current (dark current) while sweeping the electric voltage applied to the electrode 30 under a condition where an electric voltage Vce=5 V is applied between the emitter region 11 and the collector region 13 via an electrode or the like. In FIG. 4, "Id(1)" represents a characteristic of the semiconductor device 1, and "Id(1X)" represents a characteristic of the semiconductor device 1X.

Meanwhile, in the semiconductor device 1, the impurity concentration of the high impurity concentration region 15 is set to be greater than or equal to ten times the greatest impurity concentration in the base region 12. The width W of the high impurity concentration region 15 is set to be about 0.2 to 1.0 µm with respect to the light receiving cell (10×10 µm$^2$).

As shown by "Id(1X)" in FIG. 4, in the semiconductor device 1X which is not provided with a high impurity concentration region 15, when the electric voltage applied to the electrode 30 exceeds about 0.2 V, the dark current starts increasing. The dark current starts increasing, since the parasitic MOS transistor 90 turns ON. That is, in the semiconductor device 1X, a threshold value at which the parasitic MOS transistor 90 turns ON is about 0.2 V.

On the other hand, as shown by "Id(1)" in FIG. 4, in the semiconductor device 1 which is provided with the high impurity concentration region 15, when the electric voltage applied to the electrode 30 is from 0 to about 3.7 V, the dark current is less than or equal to a measurement limit (less than or equal to 1×10−11 A). Then, when the electric voltage applied to the electrode 30 exceeds about 3.7 V, the dark current starts increasing. That is, in the semiconductor device 1, the threshold value at which the parasitic MOS transistor 90 turns ON is about 3.7 V, which is shifted from the semiconductor device 1X to the higher side of the threshold value by about 3.5 V.

In this way, it is found that in the semiconductor device 1, which is provided with the high impurity concentration region 15, the threshold value at which the parasitic MOS transistor 90 turns ON becomes greater (shifted to the higher side), compared with the semiconductor device 1X, which is not provided with the high impurity concentration region 15.

Figure 5:
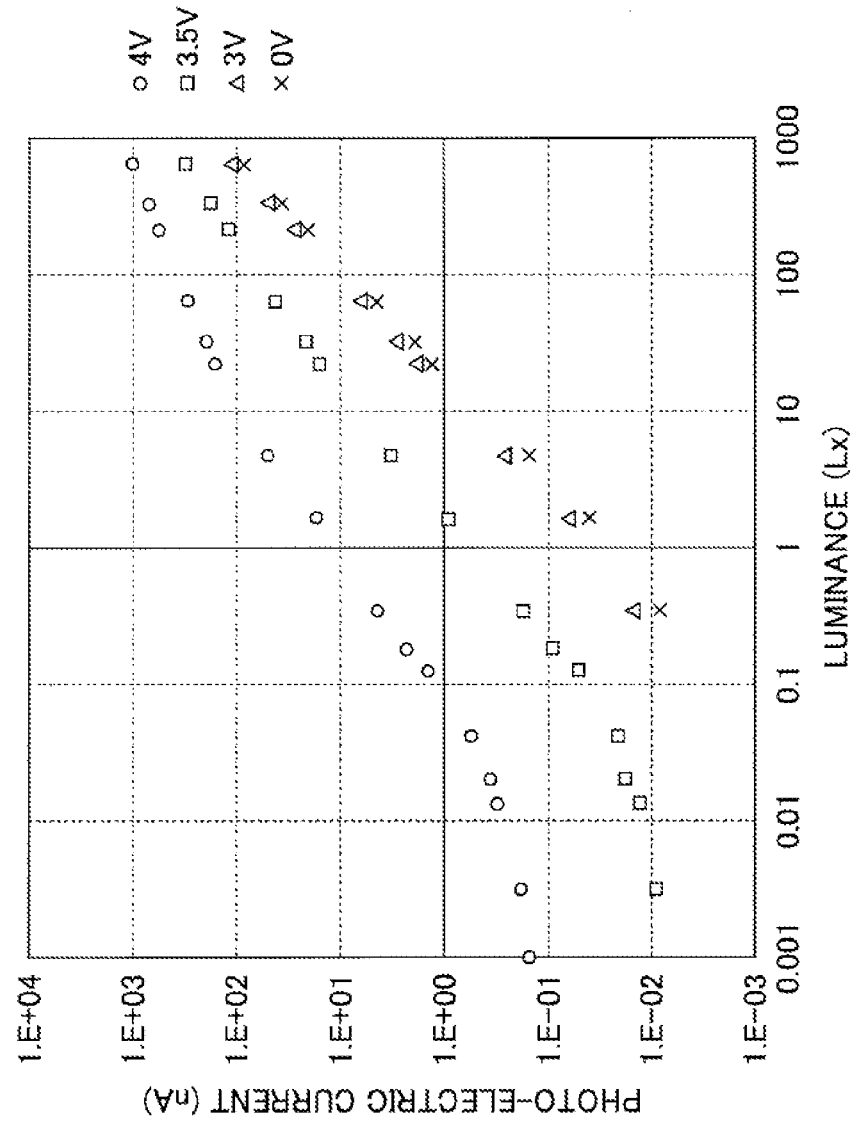
FIG. 5 is a diagram illustrating a current amplification factor changing according to a voltage applied to an electrode.

FIG. 5 is a diagram illustrating a current amplification factor changing according to a voltage applied to an electrode, and shows a relation between luminance (abscissa) and photo-electric current (ordinate) in a case of applying a predetermined electric voltage to the electrode 30 of the semiconductor device 1. Meanwhile, the axis of abscissa and the axis of ordinate are logarithmic axes.

Specifically, data in FIG. 5 are obtained by measuring the emitter current (photo-electric current) obtained by irradiating the light receiving cell (10×10 µm$^2$) with halogen light while fixing the electric voltage applied to the electrode 30 to a predetermined electric voltage under a condition where an electric voltage Vce=5 V is applied between the emitter region 11 and the collector region 13 via an electrode or the like. Meanwhile, in FIG. 5, "O", "□", "Δ" and "X" represent characteristics in a case where the predetermined electric voltage applied to the electrode 30 is set to 4 V, 3.5 V, 3 V and 0 V, respectively.

Meanwhile, in the semiconductor device 1, the impurity concentration of the high impurity concentration region 15 is set to be greater than or equal to ten times the greatest impurity concentration in the base region 12. The width W of the high impurity concentration region 15 is set to be about 0.2 to 1.0 µm.

As shown in FIG. 5, in the semiconductor device 1, by changing the electric voltage applied to the electrode 30, the photo-electric current varies with respect to the luminance. In this way, it is confirmed that in the semiconductor device 1, even if the high impurity concentration region 15 is provided, the current amplification factor is changed by the electric voltage applied to the electrode 30, and thereby the photo-electric current can be changed.

[Manufacturing Method of Semiconductor Device]

FIGS. 6A to 8B are diagrams illustrating an example of a manufacturing process of the semiconductor device according to the first embodiment, and show a cross section corresponding to FIG. 1A.

Figure 6A:
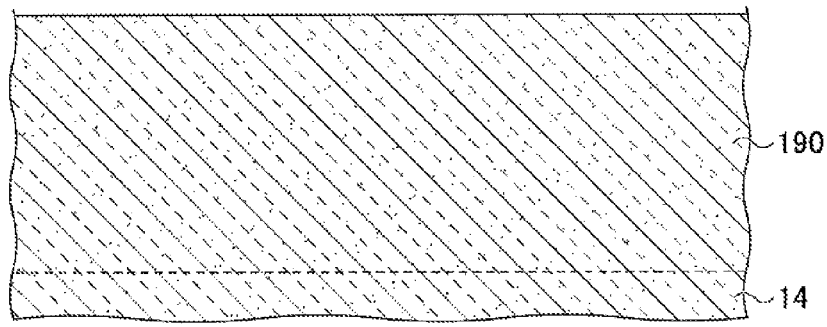
FIGS. 6A to 6C are diagrams illustrating an example of a manufacturing process of the semiconductor device according to the first embodiment.

First, as shown in FIG. 6A, for example, a silicone substrate provided with an N-type epitaxial layer 190 with an electrical resistivity of 1 Ωcm on an Ni-type low-resistivity region 14 with an electrical resistivity of 6 mΩcm is prepared. A thickness of the epitaxial layer 190 may be set to an arbitrary value according to an absorption rate for a wavelength of a light source.

Figure 6B:
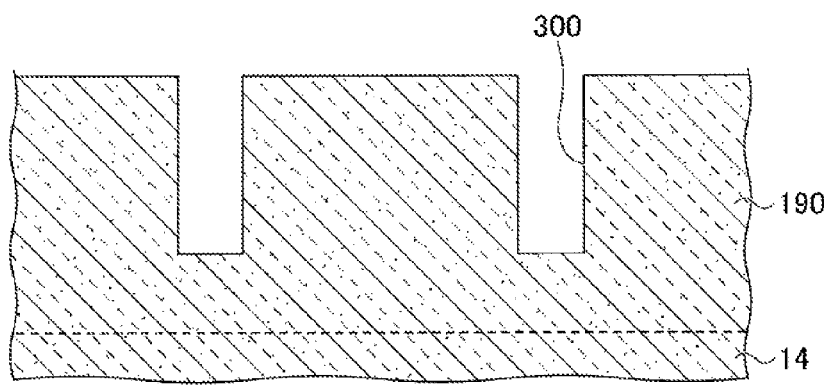

Next, as shown in FIG. 6B, in order to embed the electrode 30, a trench 300 is formed in the epitaxial layer 190 penetrating through a region which will be the emitter region 11 and the base region 12 into a region which will be the collector region 13. The trench 300 may be formed by, for example, dry etching. A width of the trench 300 may be, for example, about 0.3 to 0.8 µm. A depth of the trench 300 may be, for example, about 4 to 20 µm.

Figure 6C:
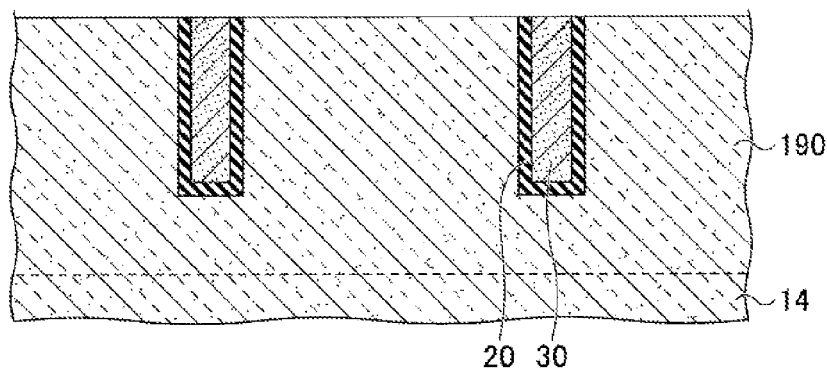

Next, as shown in FIG. 6C, an insulation film 20 with a thickness of about 20 nm is formed on a bottom face and on an internal face of the trench 300. Then, the electrode 30 is formed inside the trench 300 via the insulation film 20. Specifically, at first, for example, an insulation film 20 (silicon dioxide film) with a thickness of about 20 nm, is formed by thermal oxidation method on the bottom face and on the internal face of the trench 300 and on a front face of the epitaxial layer 190. However, a silicon nitride film or the like may be used for the insulation film 20.

Then, for example, polysilicon is deposited inside the trench 300 and on the front face of the epitaxial layer 190, on which the insulation film 20 is formed, by CVD method or sputtering method. Afterwards, by removing the polysilicon formed on the front face using an etch back, and leaving only inside the trench 300, the electrode 30 formed of polysilicon is prepared. Meanwhile, in order to prepare the electrode 30 with a small electric resistance, it is preferable to deposit polysilicon in which phosphorous impurity is saturated.

Figure 7A:
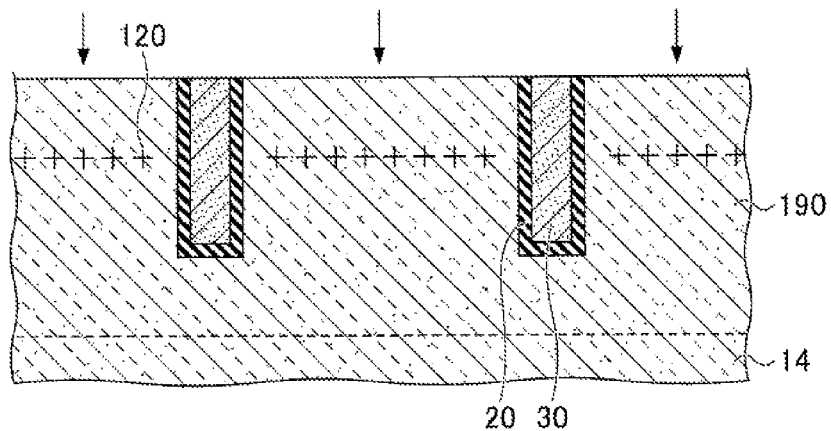
FIGS. 7A to 7C are diagrams illustrating another example of the manufacturing process of the semiconductor device according to the first embodiment.

Next, as shown in FIG. 7A, in order to form a P-type base region 12, P-type impurity 120 is injected. Specifically, for example, boron is injected as the P-type impurity 120, at an acceleration energy of 30 KeV and an injected dose of 3.2×10$^{13}$ cm$^{-2}$.

Figure 7B:
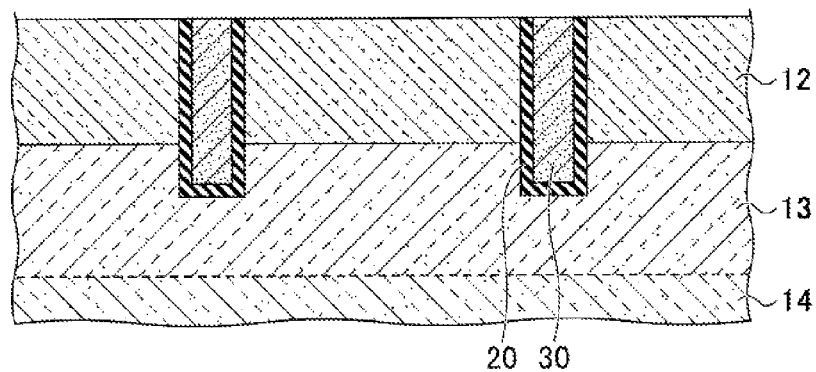
Figure 7C:
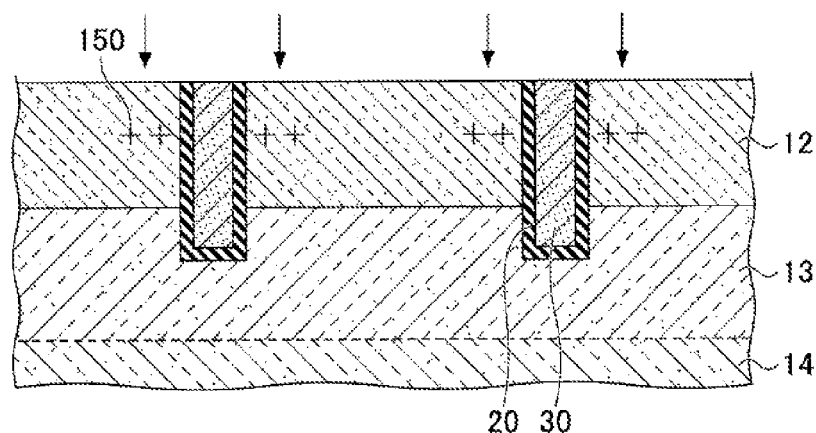

Then, as shown in FIG. 7B, for example, by performing heat treatment at about 1150° C. for about 50 minutes, the P-type impurity 120 is thermally diffused and activated, and thereby a base region 12 with a depth of about 1.5 mm is formed. Meanwhile, a layer below the base region 12 is the collector region 13. The depth and an impurity concentration may be set to arbitrary values, with which the current amplification factor is stable, according to an absorption rate for a wavelength of the light source Next, as shown in FIG. 7C, a P-type impurity 150 is injected in order to form a P$^+$-type high impurity concentration region 15 contacting the insulation film 20 and the base region 12 just below the region which will be the emitter region 11. Specifically, for example, boron is injected as the P-type impurity 150, at 180 KeV and 1×10$^{13}$ cm$^{-2}$.

Figure 8A:
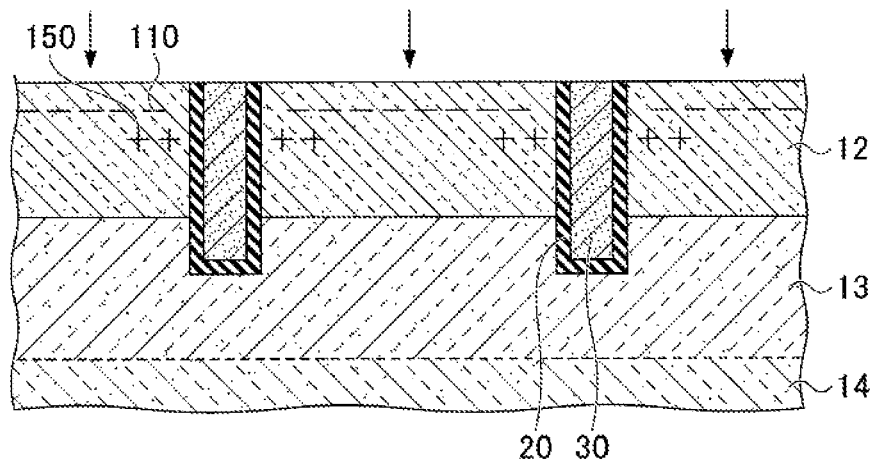
FIGS. 8A and 8B are diagrams illustrating yet another example of the manufacturing process of the semiconductor device according to the first embodiment.

Next, as shown in FIG. 8A, in order to form an N$^+$-type emitter region 11, N-type impurity 110 is injected. Specifically, for example, phosphorus is injected as the N-type impurity 110, at 50 KeV and $6\times10^{13}$ cm$^{-2}$.

Figure 8B:
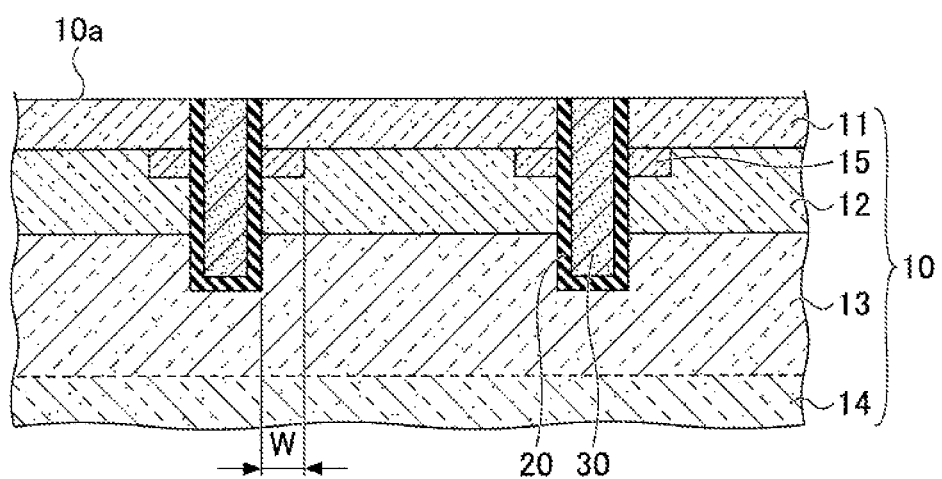

Then, as shown in FIG. 8B, for example, by performing heat treatment at about 920° C. for about 40 minutes, the N-type impurity 110 and the P-type impurity 150 are thermally diffused and activated, and thereby the emitter region 11 is formed on a side of a front face 10a and the high impurity concentration region 15 is formed just below the emitter region 11. Meanwhile, the diffusion is preferably shallow, since the emitter region 11 prevents light from being absorbed.

Afterwards, on the front face 10a of the semiconductor substrate 10, an interlayer insulation film 40 is formed by the CVD method or the like, a contact 50 connected to the emitter region 11 is formed in the interlayer insulation film 40, and further a metallic electrode 60 connected to the contact 50 is formed on the interlayer insulation film 40. Moreover, the polysilicon forming the electrode 30 is extended from a periphery of a region where each of the light receiving cells is formed, and forms an extraction wiring of the electrode 30. Meanwhile, since the metallic electrode 60 shields light, the metallic electrode 60 is preferably arranged on the electrode 30 to the extent possible. According to the respective above-described processes, the semiconductor device 1 as shown in FIGS. 1A and 1B is completed.

In this way, in the semiconductor device 1 according to the first embodiment, the electrode 30 is embedded in the semiconductor substrate 10 via the insulation film 20, and the emitter region 11 contacting the electrode 30, the base region 12 and the collector region 13 are sequentially formed in the depth direction from the side of the front face 10a of the semiconductor substrate 10. According to the above-described configuration, by applying a voltage to the electrode 30, a width of the base region 12 varies, and as a result a current amplification factor of the semiconductor device 1 can be changed. (Sensitivity for light intensity can be enhanced.)

Moreover, in a region deeper than the emitter region 11 and shallower than the collector region 13, the high impurity concentration region 15, whose impurity concentration is greater than that of the base region 12 and which has the same conductivity type as the base region 12 is arranged contacting the insulation film 20 and the base region 12. According to the above-described configuration, a channel concentration of a parasitic MOS transistor 90 formed on the semiconductor substrate 10 is made greater, and a threshold value of the parasitic MOS transistor 90 is shifted to higher. As a result, conventional one, the increase of dark current can be suppressed in the semiconductor device 1.

The technique disclosed in Japanese Published Patent Application No. 2013-187527 has a problem that in a case of increasing a current amplification factor and enhancing sensitivity for light intensity, a dark current increases.

On the other hand, in the semiconductor device 1 according to the present embodiment, the sensitivity for light intensity can be enhanced while suppressing the increase of dark current.

First Variation of First Embodiment

In the first variation of the first embodiment, a high impurity concentration region arranged at a position different from the first embodiment will be illustrated. Meanwhile, in the first variation of the first embodiment, an explanation of the same component as the embodiment which has already been explained may be omitted.

Figure 9A:
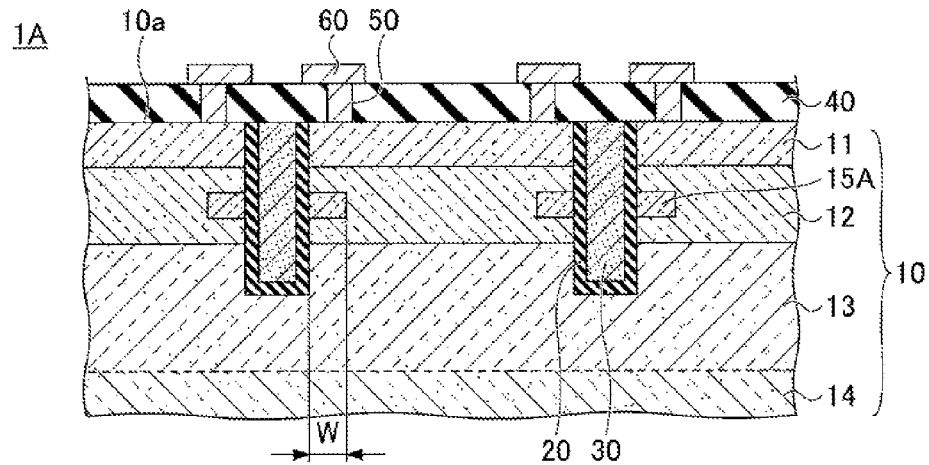
FIGS. 9A to 9C are diagrams illustrating an example of a main part of a semiconductor device according to a first variation of the first embodiment.
Figure 9B:
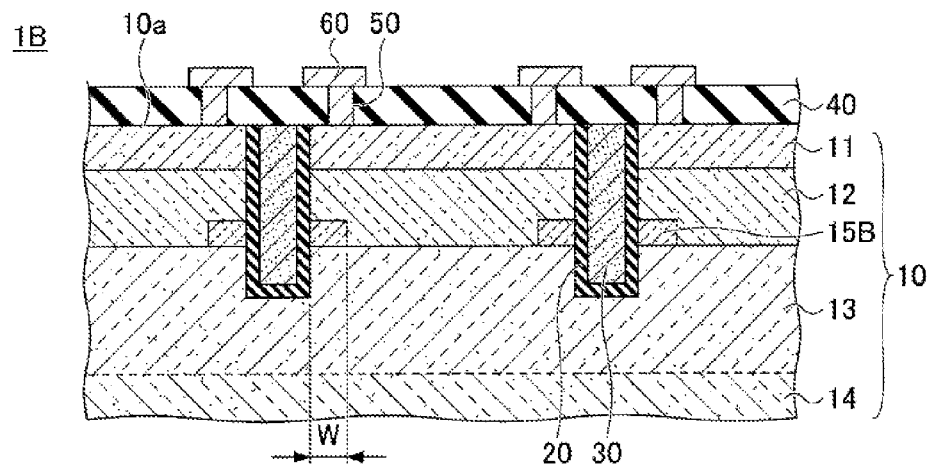
Figure 9C:
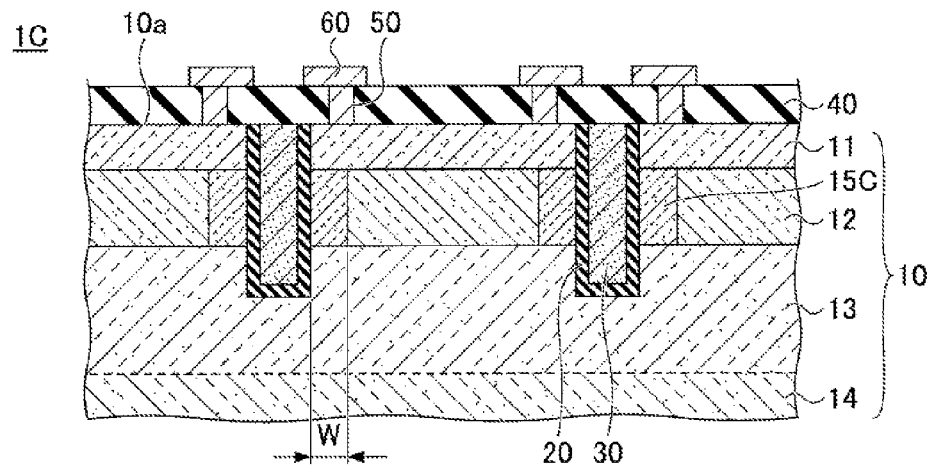

FIGS. 9A to 9C are diagrams illustrating an example of a main part of a semiconductor device according to a first variation of the first embodiment, and show cross sections corresponding to FIG. 1A.

In a semiconductor device 1A shown in FIG. 9A, a high impurity concentration region 15A contacts only an insulation film 20 and a base region 12 without contacting an emitter region 11 and a collector region 13.

In order to form the high impurity concentration region 15A, an acceleration voltage has only to be made greater in the process shown in FIG. 7C in the first embodiment so that an injection position of a P-type impurity 150 becomes deeper. For example, by injecting boron as the P-type impurity (at 400 KeV and $1\times10^{13}$ cm$^{-2}$), the high impurity concentration region 15A can be formed at the position shown in FIG. 9A.

Since also in the configuration shown in FIG. 9A, a channel concentration of a parasitic MOS transistor 90 can be made greater as in the configuration shown in FIGS. 1A and 1B, a threshold value of the parasitic MOS transistor 90 can be made greater and an increase of dark current can be suppressed.

In a semiconductor device 1B shown in FIG. 9B, a high impurity concentration region 15B is provided just above the collector region 13 so as to contact the insulation film 20 and the base region 12.

In order to form the high impurity concentration region 15B, the acceleration voltage has only to be made greater than in the case of FIG. 9A in the process shown in FIG. 7C in the first embodiment so that the injection position of the P-type impurity 150 becomes deeper. For example, by injecting boron as the P-type impurity (at 1000 KeV and $1\times10^{13}$ cm$^{-2}$), the high impurity concentration region 15B can be formed at the position shown in FIG. 9B.

Since also in the configuration shown in FIG. 9B, the channel concentration of the parasitic MOS transistor 90 can be made greater as in the configuration shown in FIGS. 1A and 1B, the threshold value of the parasitic MOS transistor 90 can be made greater and the increase of dark current can be suppressed.

In the semiconductor devices 1, 1A and 1B, the high impurity concentration regions 15, 15A and 15B are provided in parts which are deeper than the emitter region 11 and shallower than the collector region 13 in the depth direction, respectively. On the other hand, in the semiconductor device 13 shown in FIG. 9C, the high impurity concentration region 15C is provided in an entirety which is deeper than the emitter region 11 and shallower than the collector region 13 in the depth direction.

That is, in the semiconductor device 1C, the high impurity concentration region 15C is arranged from just below the emitter region 11 to just above the collector region 13 contacting the insulation film 20 and the base region 12. In other words, the high impurity concentration region 15C having almost the same thickness as the base region 12 is provided between the insulation film 20 and the base region 12.

In order to form the high impurity concentration region 15C, the acceleration voltage has only to be changed to perform a multistage injection of the P-type impurity 150 in the process shown in FIG. 7C in the first embodiment so that the concentration becomes greater just below the emitter region, in a region further below it and just above the collector region 13. For example, by performing injection of boron (at 1000 KeV and $1\times10^{13}$ cm$^{-2}$), injection of boron (at 400 KeV and $1 \times 10^{13}$ cm$^{-2}$) and injection of boron (at 180 KeV and $1 \times 10^{13}$ cm$^{-2}$) in series, the high impurity concentration region 15C can be formed at the position shown in FIG. 9C.

Since also in the configuration shown in FIG. 9C, the channel concentration of the parasitic MOS transistor 90 can be made greater as in the configuration shown in FIGS. 1A and 1B, the threshold value of the parasitic MOS transistor 90 can be made greater and the increase of dark current can be suppressed.

In this way, as long as the high impurity concentration region contacts the insulation film 20 and the base region 12, wherever the high impurity concentration region is arranged, the threshold value of the parasitic MOS transistor 90 becomes greater and the increase of dark current can be suppressed.

However, for increasing the threshold value of the parasitic MOS transistor 90, it is the most effective to arrange the high impurity concentration region on a source side (a side of the emitter region 11) of the parasite MOS transistor 90. Moreover, the high impurity concentration region is preferably arranged as close as possible to the front face 10a of the semiconductor substrate 10 in manufacturing the semiconductor device 1 to the extent of requiring relatively low acceleration voltage upon injecting impurity. From the above-described standpoint, the semiconductor device 1 in which the high impurity concentration region 15 is arranged just below the emitter region 11 (See FIGS. 1A and 1B) can be said to be the most preferable configuration.

Second Variation of First Embodiment

In the second variation of the first embodiment, an electrode 30 penetrating the collector region 13 will be illustrated. Meanwhile, in the second variation of the first embodiment, an explanation of the same component as the embodiment which has already been explained may be omitted.

Figure 10A:
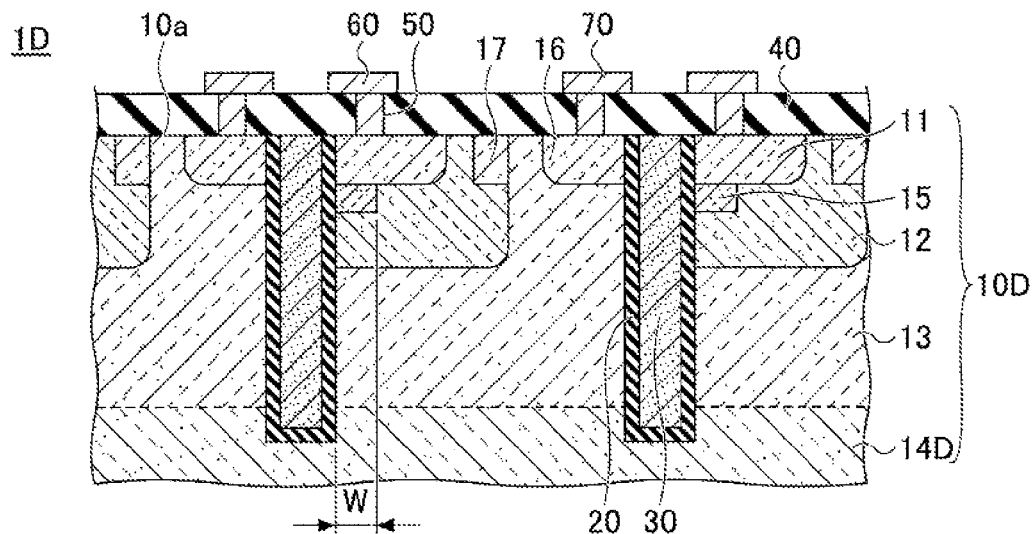
FIGS. 10A and 10B are diagrams illustrating an example of a main part of a semiconductor device according to a second variation of the first embodiment.
Figure 10B:
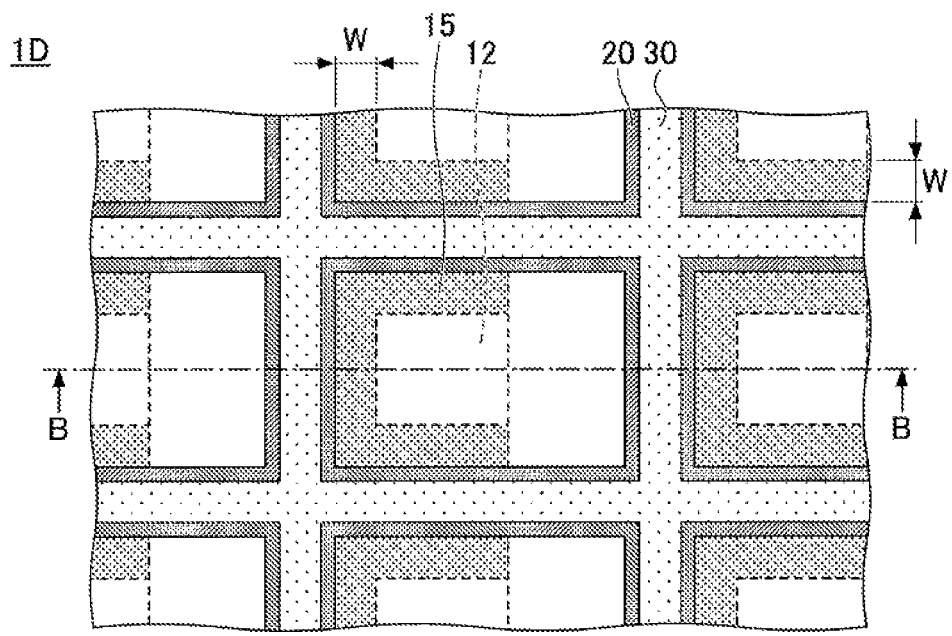

FIGS. 10A and 10B are diagrams illustrating an example of a main part of a semiconductor device according to the second variation of the first embodiment. FIG. 10B is a plan view and FIG. 10A is a cross-sectional view cut along a line B-B in FIG. 10B. However, in FIG. 10B, only the base region 12, the high impurity concentration region 15, the insulation film 20 and the electrode 30 are shown, and a satin pattern is appropriately used as a matter of convenience. Meanwhile, an arrangement of the emitter region 11, the base region 12, the collector region 13, an ohmic region 16 and a high concentration base region 17 is the same as FIG. 11B, which will be described later.

In a semiconductor device 1D shown in FIGS. 10A and 10B, a P-type substrate is used for a semiconductor substrate 10D. In the semiconductor device 1D, an electrode 30 passes through the emitter region 11 (e.g. Ni-type), the base region 12 (e.g. P-type) and the collector region 13 (e.g. N-type). An apical part of the electrode 30 reaches a P-type region 14D.

According to the above-described configuration, in each of the light receiving cells, the emitter regions 11 are mutually separated, the base regions 12 are mutually separated, and the collector regions 13 are mutually separated (i.e. the collector regions 13 in the respective light receiving cells are electrically independent from each other). Meanwhile, in the same way as the semiconductor device 1 (see FIGS. 1A and 1B), just below the emitter region 11, the high impurity concentration region 15 is arranged contacting the insulation film 20 and the base region 12.

Moreover, the emitter region 11, the base region 12 and the collector region 13 exist facing the front face 10a of the semiconductor substrate 10D. Then, the emitter region 11 is electrically connected with a metallic electrode 60 (emitter electrode) via a contact 50. Moreover, on a front face of the collector region 13, an Ni-type ohmic region 16 is arranged. The ohmic region 16 is connected to a metallic electrode 70 (collector electrode) via the contact 50.

In other words, a horizontal bipolar structure exists on a side of the front face 10a of the semiconductor substrate 10D along with a vertical bipolar structure in the depth direction of the semiconductor substrate 10D. In the horizontal bipolar structure, variation of a current amplification factor for collector electric current is great. Then, in order to suppress the variation of the current amplification factor for collector electric current, it is preferable to arrange a P$^+$-type high concentration base region 17 is preferably arranged at a position located separately from the emitter region 11 on the front face of the base region 12. For example, the high concentration base region 17 with a concentration of greater than or equal to $1 \times 10^{19}$ cm$^{-3}$ can be arranged at a position which is separated from the emitter region 11 by about 1 μm on the front face of the base region 12.

According to the configuration shown in FIGS. 10A and 10B, in the semiconductor device 1D, different electric voltages can be applied to the metallic electrode 60 (emitter electrode) and the metallic electrode 70 (collector electrode) in each of the light receiving cells. Therefore, since an emitter electric potential and a collector electric potential can be set freely and it is possible to select the metallic electrode 60 (emitter electrode) or the metallic electrode 70 (collector electrode) to acquire an output signal, a degree of freedom upon the circuit operating can be enhanced. Meanwhile, an effect by forming the high impurity concentration region 15 is the same as the first embodiment.

Third Variation of First Embodiment

In a third variation of the first embodiment, an SOI (Silicon On Insulator) substrate used for the semiconductor substrate will be illustrated. Meanwhile, in the third variation of the first embodiment, an explanation of the same component as the embodiment which has already been explained may be omitted.

Figure 11A:
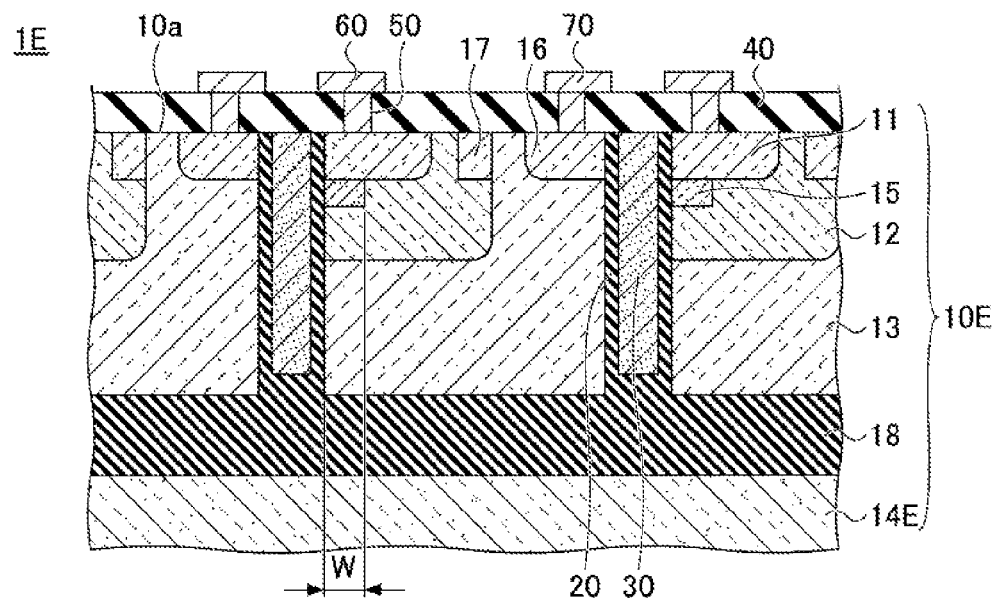
FIGS. 11A and 11B are diagrams illustrating an example of a main part of a semiconductor device according to a third variation of the first embodiment.
Figure 11B:
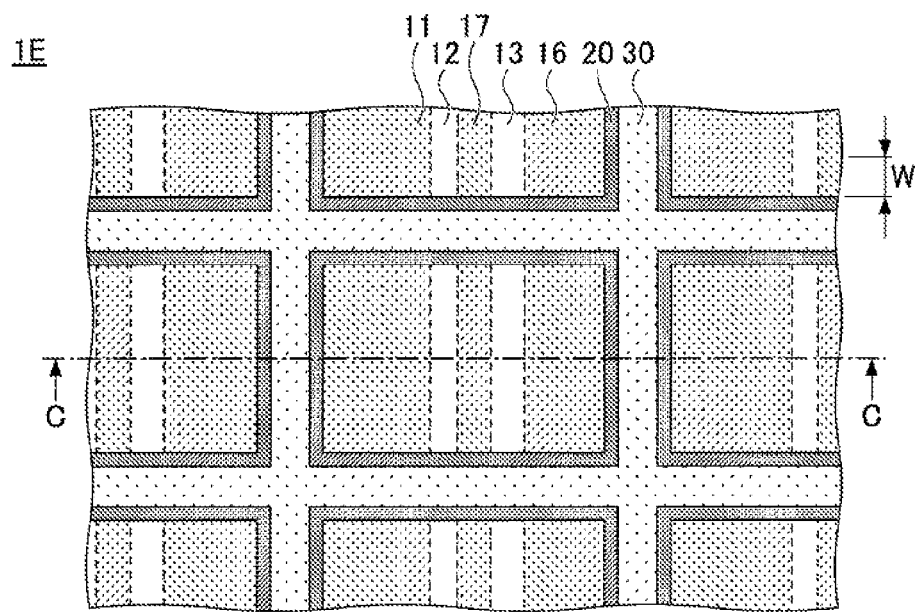

FIGS. 11A and 11B are diagrams illustrating an example of a main part of a semiconductor device according to the third variation of the first embodiment. FIG. 11B is a plan view and FIG. 11A is a cross-sectional diagram cut along a line C-C in FIG. 11B. However, in FIG. 11B, only an emitter region 11, a base region 12, a collector region 13, an ohmic region 16, a high concentration base region 17, an insulation film 20 and an electrode 30 are shown, and a satin pattern is appropriately used as a matter of convenience. Meanwhile, an arrangement of a high impurity concentration region 15 is the same as above-described FIG. 10B.

In a semiconductor device 1E shown in FIGS. 11A and 11B, for a semiconductor substrate 10E, an SOI substrate in which a BOX (Buried Oxide) oxide film 18 with a thickness of about 1 mm and a silicon active layer are arranged in series on a P-type silicon substrate 14E is used. Then, in the silicon active layer arranged on the BOX oxide film 18, the emitter region 11, the base region 12, the collector region 13, the high impurity concentration region 15, the ohmic region 16 and the high concentration base region 17 of the same structure as the semiconductor device 1D (see FIGS. 10A and 10B) are arranged. Below the collector region 13, the BOX oxide film 18 contacting the insulation film 20 is arranged.

In the semiconductor device 1E, the electrode 30 passes through the emitter region 11, the base region 12 and the collector region 13, and the insulation film 20 coating an apical part of the electrode 30 reaches the BOX oxide film 18. According to the above-described configuration, in each of the light receiving cells, the emitter regions 11 are mutually separated, the base regions 12 are mutually separated and the collector regions 13 are mutually separated (i.e. the collector regions 13 in the respective light receiving cells are electrically independent from each other).

The semiconductor device 1E has a structure in which adjacent light receiving cells are mutually insulated and separated completely, different from the structure of the semiconductor devices 1 to 1C, in which the collector region 13 is common, or from the structure of the semiconductor device 1D, in which the P-type region 14D and the collector region 13 form a PN junction. As a result, since diffusion of electric charges occurring due to injection of light is restricted only inside each of the light receiving cells and does not move to an adjacent light receiving cell, color mixture can be suppressed in a case where the semiconductor device 1E is used for an imaging apparatus. Meanwhile, an effect by forming the high impurity concentration region 15 is the same as the first embodiment.

Second Embodiment

In a second embodiment, an imaging apparatus in which the semiconductor device 1 according to the first embodiment is used for a photo transistor will be illustrated. Meanwhile, in the second embodiment, an explanation of the same component as the embodiment which has already been explained may be omitted.

Figure 12:
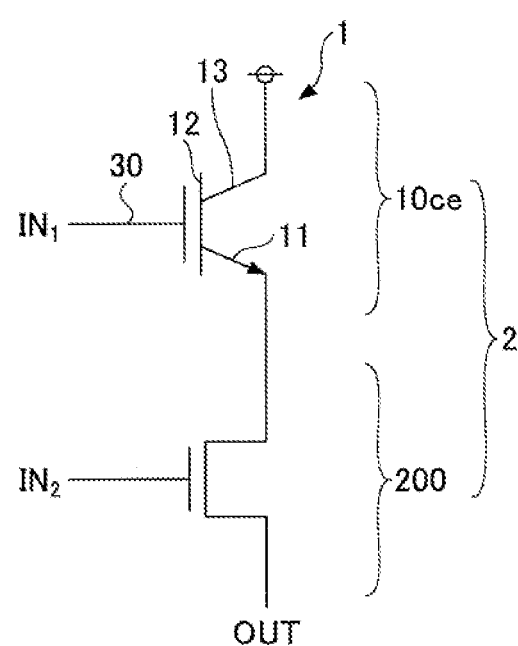
FIG. 12 is a diagram illustrating an example of a circuit configuration of a single imaging cell according to a second embodiment.

FIG. 12 is a diagram illustrating an example of a circuit configuration of a single imaging cell. As shown in FIG. 12, the single imaging cell 2 includes a light receiving cell 10ce(photo transistor) of the semiconductor device 1 and a MOS switch for reading 200 which is turned ON/OFF according to an electric voltage applied to an $IN_2$ terminal. While the imaging cell 2 is irradiated with light, in a case of turning off the MOS switch 200, a base region 12 of the light receiving cell 10ce accumulate electric charges. By turning on the MOS switch 200, an output electric current (photoelectric current) amplified with a current amplification factor which the light receiving cell 10ce possesses can be extracted from an OUT terminal of the MOS switch 200.

In a case where light intensity for irradiation is low and the output electric current to be extracted is small, sensitivity for the light intensity can be enhanced by applying an electric voltage to the $IN_1$ terminal (an electrode 30 adjacent to the light receiving cell 10ce) so as to increase the current amplification factor and thereby increasing the output electric current. Conversely, in a case where the light intensity becomes great and the output electric current is saturated, by applying an electric voltage to the $IN_1$ terminal so as to decrease the current amplification factor and lowering the sensitivity for the light intensity, an accurate output electric current corresponding to the light intensity can be obtained.

Meanwhile, the MOS switch 200 can be formed on the semiconductor substrate 10 included in the semiconductor device 1 and adjacent to the light receiving cell 10ce, for example.

Figure 13B:
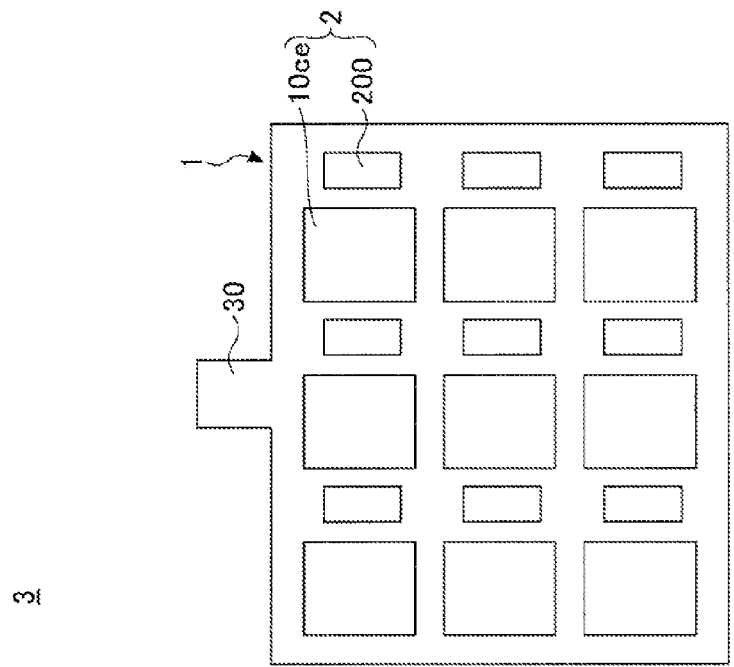
FIGS. 13A and 13B are diagrams illustrating an example of an imaging apparatus in which the single imaging cells are arranged two-dimensionally according to the second embodiment.
Figure 13A:
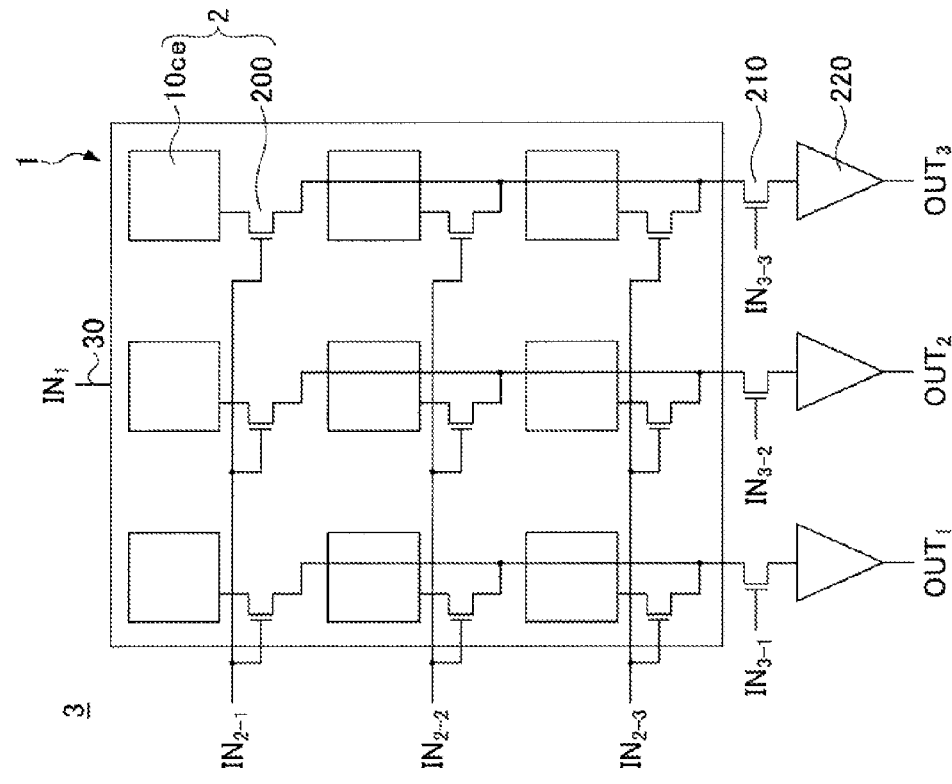

FIGS. 13A and 13B are diagrams illustrating an example of an imaging apparatus in which the single imaging cells are arranged two-dimensionally. FIG. 13A is a simplified block diagram illustrating an example of a circuit configuration of an imaging apparatus 3. FIG. 13B is a plan view illustrating an example of an arrangement of the light receiving cells 10ce and the MOS switches 200 in the imaging apparatus 3.

In the imaging apparatus 3, for example, the imaging cells are arranged in 3 columns by 3 rows. In the imaging apparatus 3, the MOS switches 200 included in the imaging cell 2 are provided with a common terminal for each column ($IN_{2-1}$, $IN_{2-2}$ or $IN_{2-3}$). Moreover, the imaging apparatus 3 includes a MOS switch, which selects a row based on electric voltages applied to the $IN_{3-1}$ to $IN_{3-3}$ terminals, and sense amplifiers for amplifying outputs of the MOS switches 210.

In the imaging apparatus 3, an address of the light receiving cell 10ce (which column and which row) is selected at a constant frequency by using the MOS switches 200 and 210. Then, an output electric current from the selected light receiving cell 10ce is amplified by the sense amplifier 220 and outputted from an $OUT_1$ terminal to an $OUT_3$ terminal, is subjected to data processing, and thereby a two-dimensional image can be obtained.

In the imaging apparatus 3, since the electrode 30 is made common, and current amplification factors of the respective imaging cells 2 are controlled by a signal inputted to the $IN_1$ terminal (an electrode 30 common to all the light receiving cells 10ce), the current amplification factors of all the light receiving cells 10ce of the semiconductor device 1 can be changed collectively.

According to the above-described configuration, in a case where light intensity of the whole screen is low and the maximum signal level of output electric current is low, entire output signal can be enlarged by increasing a current amplification factor. Moreover, in a case where an accurate output signal cannot be obtained from the sense amplifier 220 or the output signal is saturated due to an excessively great light intensity, the output signal can be reduced and changed to an accurate output signal by decreasing the current amplification factor.

FIGS. 14A and 14B are diagrams illustrating another example of the imaging apparatus in which the single imaging cells are arranged two-dimensionally. FIG. 14A is a simplified block diagram illustrating an example of a circuit configuration of an imaging apparatus 4. FIG. 14B is a plan view illustrating an example of an arrangement of the light receiving cells 10ce and the MOS switches 200 in the imaging apparatus 4. In the imaging apparatus 4 shown in FIGS. 14A and 14B, an independent electrode 30 ($IN_{1-11}$ or the like) is provided in every single imaging cell 2.

According to the above-described configuration, the current amplification factor of each of the imaging cells 2 can be set independently by applying a predetermined electric voltage to an IN terminal (an electrode 30 specific to each of the light receiving cells 10ce) corresponding to the respective imaging cell 2. Therefore, by detecting an excessively bright part or an excessively dark part in the image and feeding it back, an output signal is corrected and smoothed, and thereby image quality can be enhanced. Moreover, as in a special photographing, a contrast of an image of a part which is desired to be highlighted can be changed.

Figure 15:
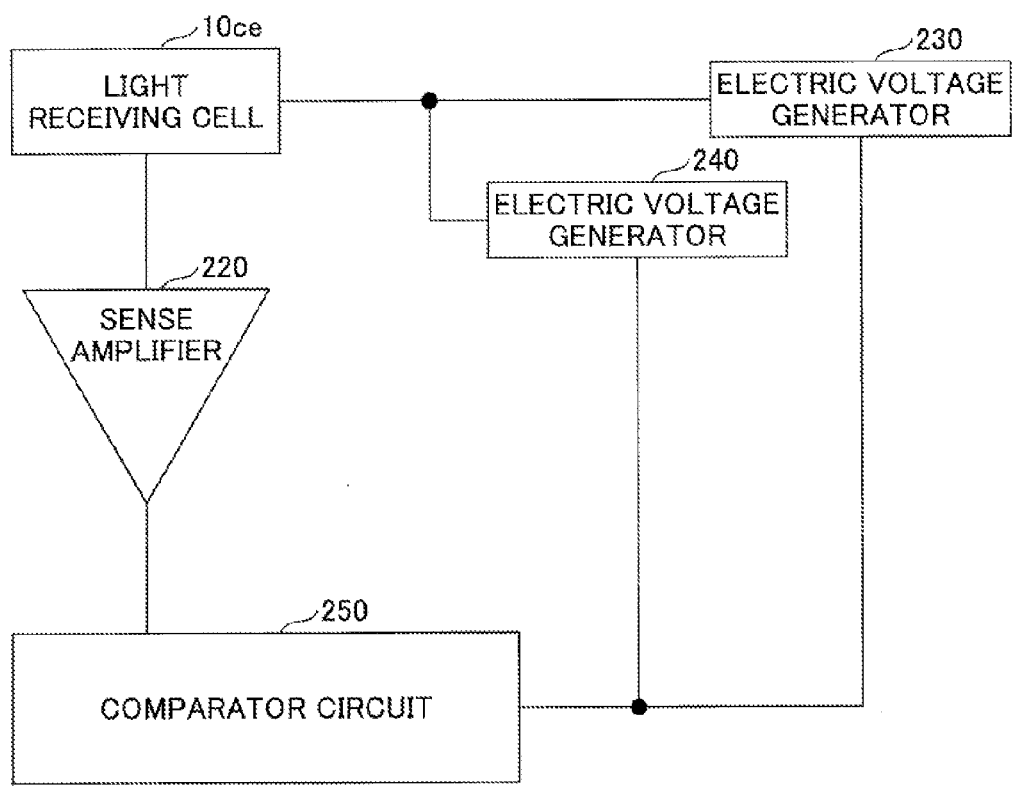
FIG. 15 is a functional block diagram illustrating an example of the imaging apparatus according to the second embodiment.

FIG. 15 is a functional block diagram illustrating an example of the imaging apparatus. In the example of FIG. 15, an electric voltage generator 230 for generating an electric voltage for which a current amplification factor is set to be quintupled or an electric voltage generator 240 for generating an electric voltage for which the current amplification factor is set to be half is properly selected based on an output from a comparator circuit 250.

The comparator circuit 250 is a circuit which monitors a maximum value of an output signal outputted from lots of light receiving cells 10*ce* (photo transistors) via the sense amplifier 220, and controls an electric voltage applied to the electrode 30 based on a result of the monitor. Meanwhile, the output signal outputted via the sense amplifier 220 is a photo-electric current of an electric voltage obtained by converting the photo-electric current. In the comparator circuit 250, a level "E" which is one-tenth of a predetermined photo-electric current "D" and a level which reaches the predetermined photo-electric current "D" are set as threshold values in advance.

For example, it is assumed that in an initial state the current amplification factor of the light receiving cell 10*ce* is set to be twice. In this case, in a case where the output signal from the sense amplifier 220 is lower than the level "E", the electric voltage generator 230 is selected according to an output from the comparator circuit 250. Then, based on an electric voltage generated by the electric voltage generator 230, the current amplification factor of the light receiving cell 10*ce* becomes quintupled.

Moreover, in a case where the output signal from the sense amplifier 220 is greater than the level "D", the electric voltage generator 240 is selected according to the output from the comparator circuit 250. Then, based on the electric voltage generated by the electric voltage generator 240, the current amplification factor of the light receiving cell 10*ce* becomes a half. Moreover, in a case where the output signal from the sense amplifier 220 is greater than or equal to the level "E" but less than or equal to the level "D", neither the electric voltage generator 230 nor the electric voltage generator 240 is selected, and the current amplification factor becomes twice.

According to the above-described configuration, even in a case of handling light intensities which are significantly different from each other, it is possible to put output signals from the sense amplifier 220 into an approximately fixed range. Meanwhile, in an example of FIG. 15, two kinds of threshold values for the comparator circuit 250 and electric voltages to be set by the electric voltage generator (electric voltage generators 230 and 240) are assumed. However, by segmentalizing the threshold values and electric voltages to be set into three or more kinds, further detailed correction becomes possible.

Meanwhile, since the semiconductor device 1 according to the first embodiment is used in the imaging apparatuses 3 and 4 according to the second embodiment, an increase of dark current can be suppressed.

Further, the present invention is not limited to these embodiments, but various variations and modifications may be made without departing from the scope of the present invention.

For example, in the first embodiment, the emitter regions 11 of the respective light receiving cells partitioned by the electrode 30 may be electrically connected and be made common, and thereby the semiconductor device 1 may be made to be a large-area single photo transistor. Also in this case, the same effect as the first embodiment is provided.

Moreover, in the second or third variation of the first embodiment, in the same way as in the first variation of the first embodiment, a high impurity concentration region may be arranged at a position other than the position just below the emitter region 11.

Moreover, in the second embodiment, any one of the semiconductor devices 1A to 1E according to the first to third variations of the first embodiment may be used instead of the semiconductor device 1.

Moreover, the conductivity types of the emitter region 11, the base region 12, the collector region 13, the high impurity concentration region 15 and the like may be opposite to those illustrated in the respective embodiments.

The present application is based on and claims the benefit of priority of Japanese Priority Application No. 2014-228766 filed on Nov. 11, 2014, the entire contents of which are hereby incorporated by reference.

What is claimed is:

1. A semiconductor device for converting incident light into an electric current, comprising:
   a semiconductor substrate;
   an electrode embedded in the semiconductor substrate;
   an insulation film contacting the electrode in the semiconductor substrate;
   a first semiconductor region of a first conductivity type, a second semiconductor region of a second conductivity type and a third semiconductor region of the first conductivity type, formed sequentially in a depth direction from a side of a front face of the semiconductor substrate; and
   a fourth semiconductor region of the second conductivity type directly contacting the insulation film and the second semiconductor region, an impurity concentration of the fourth semiconductor region being greater than an impurity concentration of the second semiconductor region.

2. The semiconductor device as claimed in claim 1, wherein the impurity concentration of the fourth semiconductor region is greater than or equal to ten times the greatest impurity concentration of the second semiconductor region.

3. The semiconductor device as claimed in claim 1, wherein the fourth semiconductor region is arranged between the first semiconductor region and the third semiconductor region so as to be separated from at least one of the first semiconductor region and the third semiconductor region.

4. The semiconductor device as claimed in claim 3, wherein the fourth semiconductor region is arranged so as to contact the first semiconductor region.

5. The semiconductor device as claimed in claim 1, wherein the fourth semiconductor region is arranged so as to contact the first semiconductor region and the third semiconductor region.

6. The semiconductor device as claimed in claim 1, wherein the electrode passes through the first semiconductor region, the second semiconductor region and the third semiconductor region.

7. The semiconductor device as claimed in claim 1, further comprising a BOX (Buried Oxide) film arranged below the third semiconductor region so as to contact the insulation film, wherein the semiconductor substrate is an SOI (Silicon On Insulator) substrate.

8. An imaging apparatus comprising the semiconductor device as claimed in claim 1 arranged two-dimensionally.

9. The imaging apparatus as claimed in claim 8, further comprising a circuit configured to monitor an electric current outputted from the semiconductor device or an electric voltage obtained by converting the electric current, and to control an electric voltage to be applied to the electrode based on the monitored electric current or the monitored electric voltage.

10. A manufacturing method of a semiconductor device for converting incident light into an electric current, the method comprising:

forming an insulation film in a semiconductor substrate;
embedding an electrode so as to contact the insulation film in the semiconductor substrate;
forming sequentially a first semiconductor region of a first conductivity type, a second semiconductor region of a second conductivity type and a third semiconductor region of the first conductivity type in a depth direction from a side of a front face of the semiconductor substrate; and
forming a fourth semiconductor region of the second conductivity type so as to directly contact the insulation film and the second semiconductor region, an impurity concentration of the fourth semiconductor region being greater than an impurity concentration of the second semiconductor region.

11. The manufacturing method of the semiconductor device as claimed in claim 10, wherein the impurity concentration of the fourth semiconductor region is made greater than or equal to ten times the greatest impurity concentration of the second semiconductor region.

12. The manufacturing method of the semiconductor device as claimed in claim 10, wherein the fourth semiconductor region is formed between the first semiconductor region and the third semiconductor region so as to be separated from at least one of the first semiconductor region and the third semiconductor region.

13. The manufacturing method of the semiconductor device as claimed in claim 12, wherein the fourth semiconductor region is arranged so as to contact the first semiconductor region.

14. The manufacturing method of the semiconductor device as claimed in claim 10, wherein the fourth semiconductor region is arranged so as to contact the first semiconductor region and the third semiconductor region.

15. The manufacturing method of the semiconductor device as claimed in claim 10, wherein the electrode passes through the first semiconductor region, the second semiconductor region and the third semiconductor region.

16. The manufacturing method of the semiconductor device as claimed in claim 10, further comprising forming a BOX film below the third semiconductor region so as to contact the insulation film, wherein the semiconductor substrate is an SOI substrate.

17. The manufacturing method as claimed in claim 16, wherein each of the BOX film and the insulation film includes silicon oxide.

18. The semiconductor device as claimed in claim 1, wherein the fourth semiconductor region of the second conductivity type is disposed immediately below, in the depth direction, the first semiconductor region of the first conductivity type.

* * * * *